(12) United States Patent
Kamei (10) Patent No.: US 7,614,128 B2
(45) Date of Patent: Nov. 10, 2009

(54) METHOD OF MANUFACTURING PIEZOELECTRIC ELEMENT AND METHOD OF MANUFACTURING LIQUID-JET HEAD

(75) Inventor: Hiroyuki Kamei, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 11/480,474

(22) Filed: Jul. 5, 2006

(65) Prior Publication Data

US 2007/0026561 A1 Feb. 1, 2007

(30) Foreign Application Priority Data

Jul. 5, 2005 (JP) ............................. 2005-196316

(51) Int. Cl.
*H01L 41/22* (2006.01)
*B41J 2/045* (2006.01)
(52) U.S. Cl. .................. 29/25.35; 29/890.1; 29/830; 29/831; 29/832; 29/842; 347/68
(58) Field of Classification Search ............... 29/25.35, 29/890.1, 830, 831, 832, 842, 843, 844; 216/27, 216/37, 101, 96; 310/324, 311, 313 A, 317, 310/357; 347/68–71, 65; 438/50, 53, 689, 438/745, 149
See application file for complete search history.

(56) References Cited

U.S. PATENT DOCUMENTS

| 5,563,640 | A  | * | 10/1996 | Suzuki ......................... 347/45 |
| 5,933,167 | A  | * | 8/1999 | Shimada et al. ................ 347/70 |
| 6,183,923 | B1 | * | 2/2001 | Kato et al. ..................... 430/96 |
| 6,398,349 | B1 | * | 6/2002 | Murai .......................... 347/68 |
| 6,419,849 | B1 | * | 7/2002 | Qiu et al. ................. 252/62.9 R |
| 6,494,567 | B2 | * | 12/2002 | Murai .......................... 347/71 |
| 6,599,757 | B1 | * | 7/2003 | Murai ........................... 438/3 |

FOREIGN PATENT DOCUMENTS

JP 11-191646 A 7/1999

* cited by examiner

*Primary Examiner*—Derris H Banks
*Assistant Examiner*—Tai Nguyen
(74) *Attorney, Agent, or Firm*—Sughrue Mion, PLLC (57) ABSTRACT

While a piezoelectric element is being formed by sequentially laminating a lower electrode whose uppermost layer is made of iridium, a titanium layer, a piezoelectric layer and an upper electrode to each other on a substrate, the piezoelectric layer is formed, by an MOD method, on the titanium layer with an contact angle of water to the surface thereof which is no less than 40°.

4 Claims, 6 Drawing Sheets

METHOD OF MANUFACTURING PIEZOELECTRIC ELEMENT AND METHOD OF MANUFACTURING LIQUID-JET HEAD

The entire disclosure of Japanese Patent Application No. 2005-196316 filed Jul. 5, 2005 is expressly incorporated by reference herein.

BACKGROUND

1. Technical Field

The present invention relates to a method of manufacturing a piezoelectric element configured of a lower electrode, a piezoelectric layer and an upper electrode, and to a method of manufacturing a liquid-jet head including the piezoelectric element.

2. Related Art

Ink-jet recording heads with the following configuration have been put into practical use. In accordance with the configuration, parts respectively of pressure generating chambers are constructed of a vibration plate. The pressure generating chambers communicate respectively with nozzle orifices from which to eject ink droplets. This vibration plate is distorted by piezoelectric elements, and thus ink in each of the pressure generating chambers is pressurized. Thereby, ink droplets are ejected from the nozzle orifices. For example, an ink-jet recording head including piezoelectric elements formed in the following manner has been among the aforementioned type of ink-jet recording heads. In the case of this ink-jet recording head, an even layer made of a piezoelectric material is formed on an entire surface of the vibration plate by means of a film-forming technique. Subsequently, this layer made of the piezoelectric material is cut into shapes corresponding to the pressure generating chambers by the lithography method. Thus, the piezoelectric elements are formed respectively for the pressure generating chambers in a way that the piezoelectric elements are independent of one another.

In addition, piezoelectric elements which make it possible to obtain satisfactory piezoelectric properties by controlling crystal orientation of the piezoelectric layer in the following manner have been proposed as the aforementioned piezoelectric elements (see the scope of clams, the like and FIG. 6 of JP-A-11-191646). In the case of piezoelectric elements of this type, crystal orientation of the piezoelectric layer is controlled by forming a titanium layer, in an island shape, on a surface of the lower electrode, which is closer to the piezoelectric layer. The titanium layer serves as cores of crystals of this piezoelectric layer.

Indeed, JP-A-11-191646 has described that it suffices that the titanium layer is formed on the surface of the lower electrode, which is closer to the piezoelectric layer. However, JP-A-11-191646 has not defined what surface physical properties the titanium layer should desirably have.

If the surface physical properties of the lower electrode are poor, an MOD solution is applied unevenly while the piezoelectric layer is being formed on the lower electrode by means of an MOD method. Accordingly, this brings about a problem that piezoelectric elements exhibiting poor piezoelectric properties are formed.

SUMMARY

An advantage of some aspects of the invention is to provide a method of manufacturing a piezoelectric element exhibiting improved piezoelectric properties, and a method of manufacturing a liquid-jet head including the piezoelectric element.

A first aspect of the invention for the purpose of achieving the advantage is a method of manufacturing a piezoelectric element, which is characterized in that, while a piezoelectric element is being formed by sequentially laminating a lower electrode whose uppermost layer is made of iridium, a titanium layer, a piezoelectric layer and an upper electrode to each other on a substrate, the piezoelectric layer is formed on the titanium layer with a contact angle of water to its surface which is 40° or greater by means of an MOD method.

The first aspect makes it possible to prevent an MOD solution from being applied unevenly, and to accordingly obtain the piezoelectric layer exhibiting satisfactory piezoelectric properties, by forming the piezoelectric layer on the titanium layer with the contact angle of water to its surface which is 40° or greater by means of the MOD method.

A second aspect of the invention is the method of manufacturing a piezoelectric element according to the first aspect, which is characterized in that the titanium layer is formed on the lower electrode with a contact angle of water to its surface which is 60° or greater.

The second aspect makes it possible to cause the contact angle of water to the surface of the titanium layer to be 40° or greater by forming the titanium layer on the lower electrode with the contact angle of water to its surface which is 60° or greater.

A third aspect of the invention is the method of manufacturing a piezoelectric element according to any one of the first and the second aspects, which is characterized in that the lower electrode is formed by sequentially laminating a first iridium layer made of iridium, a platinum layer made of platinum and a second iridium layer made of iridium to each other.

The third aspect makes it possible to ensure conductivity, and to prevent the lower electrode from delaminating.

A fourth aspect of the invention is a method of manufacturing a piezoelectric element according to any one of the first to the third aspects, which is characterized in that the piezoelectric layer is formed by use of the MOD solution with a surface tension of 20 to 30 mN/m, and with a ratio of polar components which is 25 to 35%.

The fourth aspect makes it possible for the predetermined MOD solution to be applied to the top of the titanium layer without unevenness.

A fifth aspect of the invention is a method of manufacturing a liquid-jet head, which is characterized by using the piezoelectric element manufactured by means of the manufacturing method according to any one of the first to the fourth aspects.

The fifth aspect makes it possible to realize the liquid-jet head exhibiting improved liquid-jet characteristics.

DESCRIPTION OF EXEMPLARY EMBODIMENTS

Hereinafter, descriptions will be provided for the invention on the basis of the embodiments.

Embodiment 1

Figure 1:
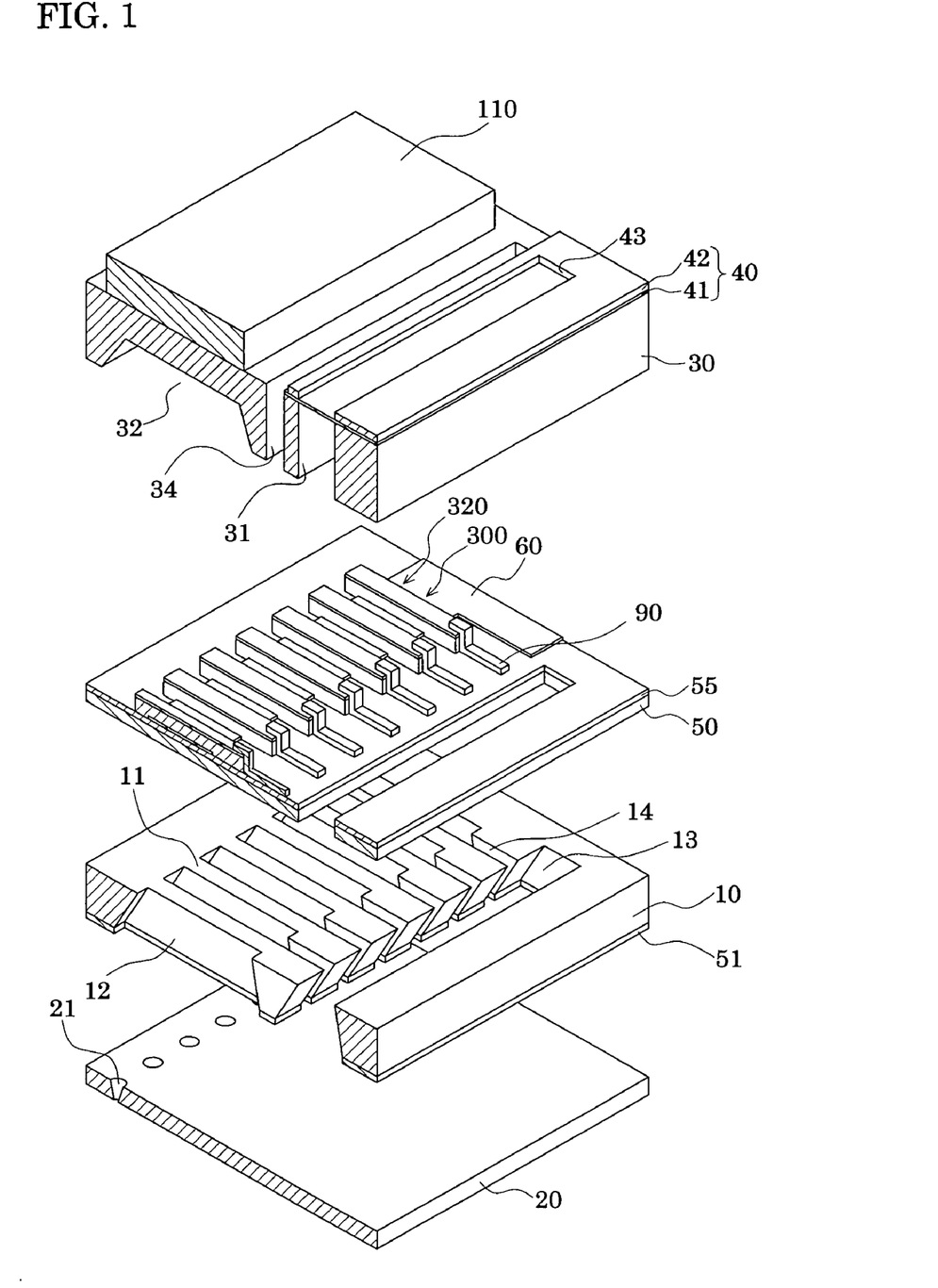
FIG. 1 is a schematic, perspective view of a recording head according to embodiment 1 of the invention.
Figure 2A:
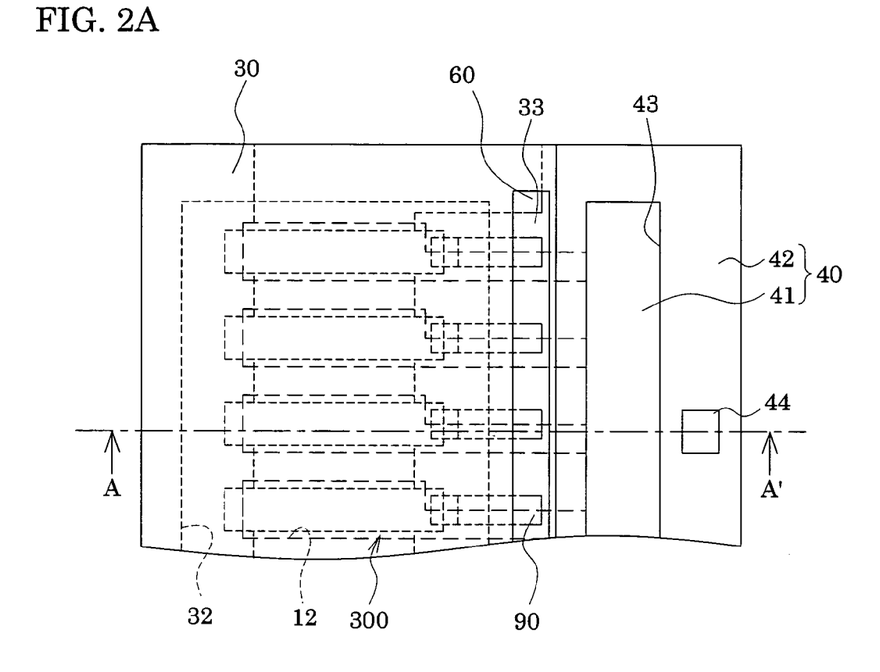
FIGS. 2A and 2B are respectively a plan view of, and a cross-sectional view of, the recording head according to embodiment 1 of the invention.
Figure 2B:
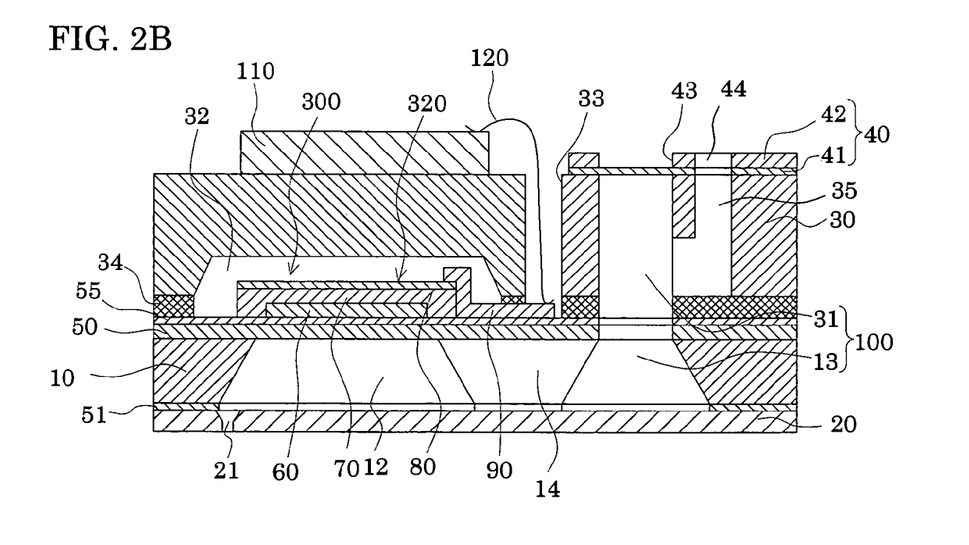

FIG. 1 is an exploded, perspective view of an ink-jet recording head according to embodiment 1 of the invention. FIG. 2A is a plan view of the ink-jet recording head shown in FIG. 1, and FIG. 2B is a cross-sectional view of the ink-jet recording head taken along the A-A' line of FIG. 2A.

In the case of this embodiment, a passage-forming substrate 10 is made of a single crystal silicon substrate. As illustrated, an elastic film 50 made of silicon dioxide formed beforehand by thermal oxidation is formed on one surface of the passage-forming substrate 10. The elastic film 50 has a thickness of 0.5 μm to 2 μm.

In this passage-forming substrate 10, a plurality of pressure generating chambers 12 are arranged side-by-side in a line by anisotropically etching a surface of the passage-forming substrate, the surface being opposite to the surface on which the elastic film 50 is formed. In a region outside of the pressure generation chambers 12 in the longitudinal direction, a communicating portion 13 is formed. The communicating portion 13 constitutes a part of a reservoir 100 which serves as a common ink chamber for the pressure generating chambers 12. The communicating portion 13 communicates with ends of the pressure generating chambers 12 in the longitudinal direction respectively through ink supply paths 14. Each of the ink supply paths 14 is formed with a width narrower than that of corresponding one of the pressure generating chambers 12. Accordingly, each of the ink supply paths 14 keeps passage resistance of ink constant. The ink flows from the communicating portion 13 to each of the pressure generating chambers 12.

In addition, a nozzle plate 20 is fixed to a surface of the passage-forming substrate 10, which surface faces orifices, by use of an adhesive agent, a thermal adhesive film or the like. In the nozzle plate 20, nozzle orifices 21 are pierced. The nozzle orifices 21 communicate respectively with ends of the pressure generating chambers 12, the ends being opposite to ends of the pressure generating chambers 12 where the pressure generating chambers 12 communicates respectively with the respective ink supply paths 14. Incidentally, the nozzle plate 20 is formed of a glass ceramic, a stainless steel or the like, the thickness of which is, for example, 0.01 mm to 1 mm and the coefficient of linear expansion of at a temperature not higher than 300° C. is, for example, 2.5 to 4.5[×10$^{-6}$/° C.]. One surface of the nozzle plate 20 covers a corresponding surface of the passage-forming substrate 10 completely. The nozzle plate 20 also plays a role of a reinforcement plate for protecting the single crystal silicon substrate from impact and external force. In addition, it does not matter that the nozzle plate 20 is formed of a material with a coefficient of thermal expansion which is nearly equal to that of the material of which the passage-forming substrate 10 is made. In this case, thermal distortion of the passage-forming substrate 10 is almost equal to that of the nozzle plate 20. Accordingly, this makes it possible to easily join the passage-forming substrate 10 and the nozzle plate 20 to each other by use of a thermosetting adhesive agent or the like.

On the other hand, as described above, the elastic film 50 made of silicon dioxide, for example, with a thickness of approximately 1.0 μm is formed on the surface of the passage-forming substrate 10, the surface being opposite to the surface of the passage-forming substrate 10 which faces the orifices. On this elastic film 50, an insulation film 55 is formed by laminating the insulation film 55 to the elastic film 50. The insulation film 55 is made of zirconia ($ZrO_2$) or the like. The thickness of the insulation film 55 is, for example, approximately 0.4 μm. Moreover, on this insulation film 55, a lower electrode film 60, a piezoelectric layer 70 and an upper electrode film 80 are formed by laminating them to each other by means of a process, which will be described later. Thus, piezoelectric elements 300 are constructed. The lower electrode film 60 has a thickness of approximately 0.1 μm to 0.5 μm. The piezoelectric layer 70 is made of lead-zirconate-titanate (PZT), and has a thickness, for example, of approximately 1.0 μm. The upper electrode film 80 is made of gold, platinum, iridium or the like, and has a thickness, for example, of approximately 0.05 μm.

In this regard, a part including the lower electrode film 60, the piezoelectric layer 70 and the upper electrode film 80 is termed as the "piezoelectric element" 300. In general, the piezoelectric elements 300 are configured in the following manner. One of the two electrodes of the piezoelectric elements 300 is used as a common electrode. The other of the two electrodes and the piezoelectric layer 70 are patterned for each of the pressure generation chambers 12. In this respect, a part constituted of a patterned one of the two electrodes and a corresponding patterned piezoelectric layer 70 in each of the piezoelectric elements 300 causes piezoelectric strain due to application of a voltage to the two electrodes of the piezoelectric element 300. This part is termed as a "piezoelectric active portion" 320. In the case of this embodiment, the lower electrode film 60 is used as a common electrode for the piezoelectric elements 300, and the upper electrode film 80 is used as an individual electrode for each piezoelectric element 300. However, it does not matter that the use of the lower electrode film 60 and the upper electrode film 80 is the other way round for the conveniences of arrangement of a driver circuit and wires. In both cases, the piezoelectric active portion is formed for each pressure generating chamber 12. Furthermore, a combination of each piezoelectric element 300 with a vibration plate is termed as a "piezoelectric actuator." The vibration plate provides displacement by a drive of each piezoelectric element 300. Incidentally, in the case of the example which has been described above, the elastic film 50, the insulation film 55 and the lower electrode film 60 jointly function as the vibration plate.

Moreover, a lead electrode 90 is connected to each of the upper electrode films 80 which are the individual electrodes respectively of the piezoelectric elements 300. Each lead electrode 90 is drawn out from a vicinity of an end of the corresponding ink supply path 14, and is extended to the top of the insulation film 55. Each lead electrode 90 is made of, for example, gold (Au) or the like.

A protective plate 30 is joined to the top of the passage-forming substrate 10, over which such piezoelectric elements 300 are formed, with an adhesive agent interposed between the protective plate 30 and the passage-forming substrate 10, specifically, to the lower electrode 60, the elastic film 50 and the lead electrodes 90. The protective plate 30 includes a reservoir portion 31 constituting at least a part of a reservoir 100. In the case of this embodiment, this reservoir portion 31 is formed in a way that the reservoir portion 31 penetrates through the protective plate 30 in the depth direction, and that the reservoir portion 31 extends in the width direction in which the pressure generating chambers 12 are arranged side-by-side in a line. In addition, as described above, the reservoir portion 31 is caused to communicate with the communicating portion 13 in the passage-forming substrate 10, and constitutes the reservoir 100 which serves as the common ink chamber of the pressure generating chambers 12.

A piezoelectric element holding portion 32 is provided to an area of the protective plate 30, which area faces the piezoelectric elements 300. The piezoelectric element holding portion 32 includes a cavity barely large enough not to hinder the piezoelectric elements 300 from moving. It suffices that the protective plate 30 includeds the cavity barely large enough not to hinder the piezoelectric elements 300 from moving. It does not matter whether or not the cavity is sealed off.

It is desirable that a material having a thermal expansion coefficient equal to that of the material of the passage-forming substrate 10 should be used for such a protective plate 30. Examples of the material include glass and ceramics. In the case of this embodiment, the protective plate 30 is formed of a single crystal silicon substrate which is the same as the material of the passage-forming substrate.

Furthermore, the protective plate 30 is provided with a through-hole 33 which penetrates through the protective plate 30 in the thickness direction. Moreover, the ends of the lead electrodes 90 and their vicinities drawn out respectively from the piezoelectric elements 300 are provided in a way that the ends and their vicinities are exposed to the through-hole 33.

As well, a driver circuit 110 is fixed to the top of the protective plate 30. The driver circuit 110 drives the piezoelectric elements 300 arranged side-by-side in a line. For example, a circuit plate, a semiconductor integrated circuit (IC) and the like can be used as this driver circuit 110. Additionally, the driver circuit 110 and each of the lead electrodes 90 are electrically connected with each other through a connecting wire 120. The connecting wire 120 is made of a conductive wire such as a bonding wire.

In addition, a compliance plate 40 is joined to the top of the protective plate 30. The compliance plate 40 is configured of a sealing film 41 and a fixing plate 42. In this regard, the sealing film 41 is made of a flexible material with a lower rigidity (for example, a polyphenylene sulfide (PPS) film with a thickness of 6 μm.) One end of the reservoir portion 31 is sealed off with this sealing film 41. Furthermore, the fixing plate 42 is formed of a hard material such as a metal (for example, a stainless steel (SUS) with a thickness of 30 μm or the like). An area of this fixing plate 42, which area faces the reservoir 100, is an opening portion 43 which is obtained by completely removing a portion corresponding to the area from the fixing plate 42 in the thickness direction. Accordingly, one end of the reservoir 100 is sealed off only by the sealing film 41 which is flexible.

Likewise, an ink introducing port 44 for supplying ink to the reservoir 100 is formed in a part of the compliance plate 40. The part of the compliance plate 40 is located outside this reservoir 100, and the location corresponds roughly to the center of the reservoir 100 in the longitudinal direction. Furthermore, the protective plate 30 is provided with an ink introducing path 35 through which the ink introducing port 44 and a side wall of the reservoir 100 communicate with each other.

Such an ink-jet recording head according to this embodiment takes in ink from the ink introducing port 44 connected with external ink supply means, which is not illustrated, and fills the interior ranging from the reservoir 100 to the nozzle orifices 21 with the ink. Thereafter, the ink-jet recording head applies a voltage between the lower electrode film 60 and each of the upper electrode films 80 corresponding to the pressure generating chambers 12, in accordance with record signals from the driver circuit. Thus, the ink-jet recording head distorts the elastic film 50, the lower electrode film 60 and the piezoelectric layers 70 with flexure. This distortion raises the pressure of each of the pressure generating chambers 12, and thereby ink droplets are ejected from the nozzle orifices 21.

Figure 3A:
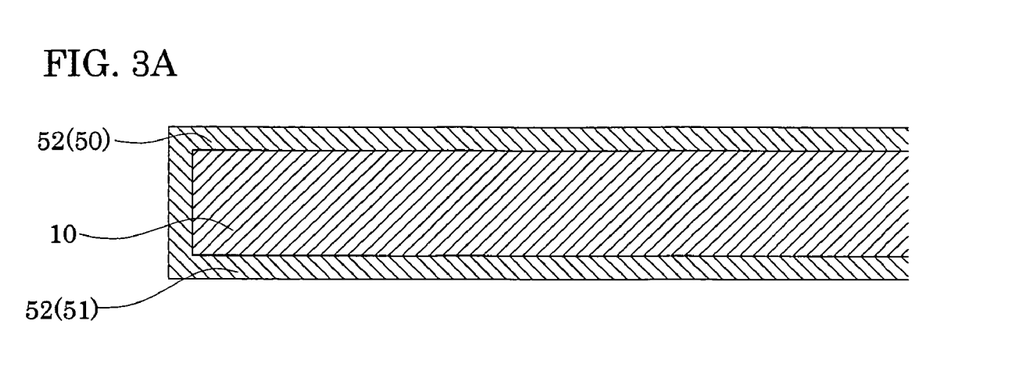
FIGS. 3A to 3C are cross-sectional views showing a method of manufacturing the recording head according to embodiment 1 of the invention.
Figure 3B:
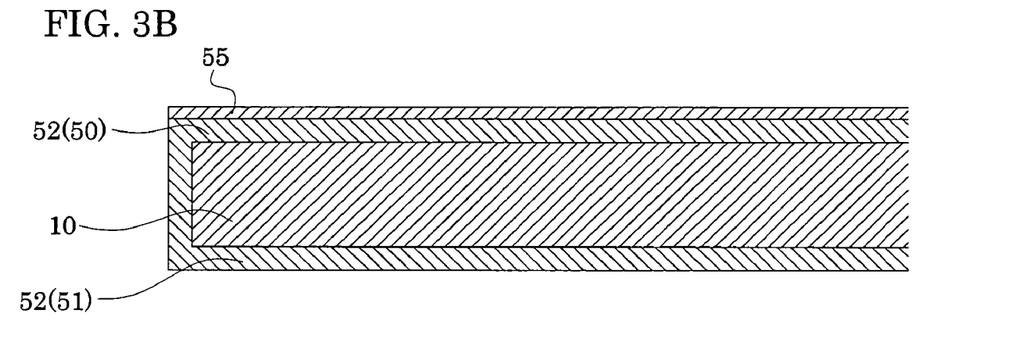

Hereinafter, descriptions will be provided for a method of manufacturing such an ink-jet recording head with reference to FIGS. 3A to 6D. It should be noted that FIGS. 3A to 6D are cross-sectional views of the pressure generating chambers 12 in the longitudinal direction. First of all, the passage-forming substrate 10 made of the single crystal silicon substrate is thermally oxidized in a diffusion furnace at a temperature of approximately 1100° C. Thus, a silicon dioxide film which will serve as the elastic film 50 is formed on one surface of the passage-forming substrate, and a silicon dioxide film which will serve as a protective film 51 is formed on the other side of the passage-forming substrate, as shown in FIG. 3A. Subsequently, a zirconium (Zr) layer is formed on the elastic film 50 (silicon dioxide film 52), as shown in FIG. 3B. Thereafter, the zirconium layer is thermally oxidized, for example, in the diffusion furnace at a temperature of 500 to 1200° C. Thus, the insulation film 55 made of zirconia ($ZrO_2$) is formed.

Figure 3C:
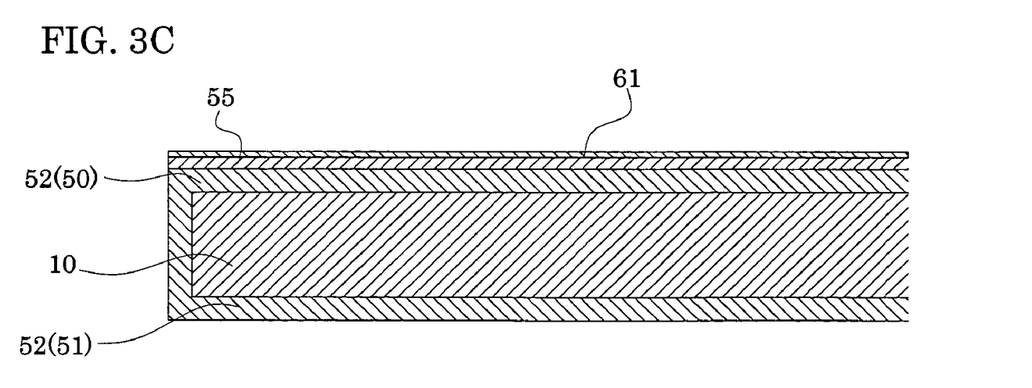
Figure 4A:
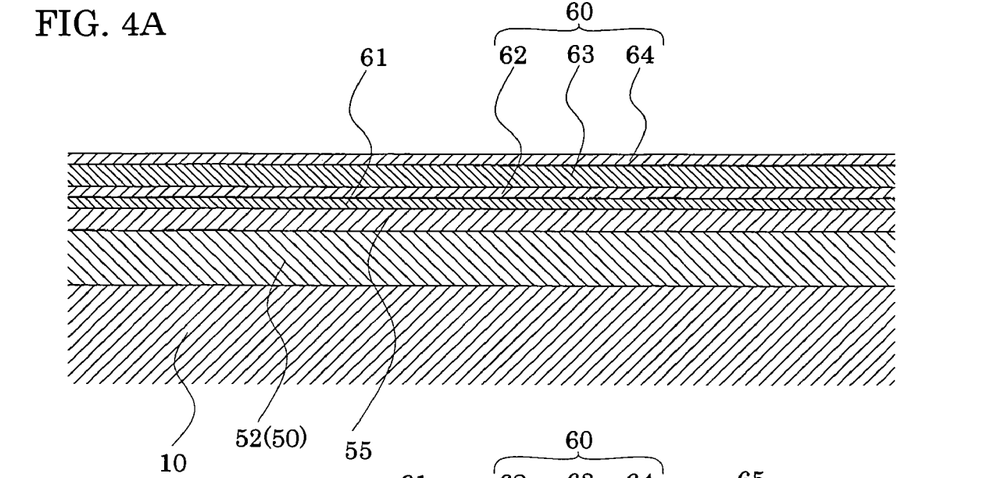
FIGS. 4A to 4C are cross-sectional views showing the method of manufacturing the recording head according to embodiment 1 of the invention.
Figure 4B:
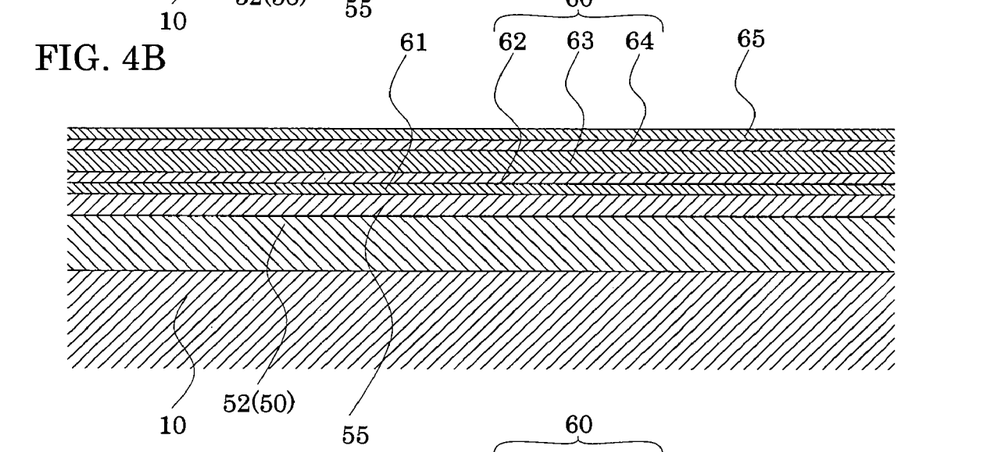

Subsequently, the lower electrode film 60 is formed. Specifically, as shown in FIG. 3C, an adhesion layer 61 is formed on the insulation film 55. For example, a layer which has a thickness of 10 nm to 50 nm, and which essentially contains at least one element selected from the group consisting of titanium (Ti) and chromium (Cr), is enumerated as this adhesion layer 61. The provision of this adhesion layer 61 makes it possible to enhance adhesion between the insulation film 55 and the lower electrode film 60. Thereafter, as shown in FIG. 4A, the lower electrode film 60 is formed on the adhesion layer 61 by laminating a first iridium layer 62, a platinum layer 63 and a second iridium layer 64 over each other on the adhesion layer 61. The first iridium layer 62 is made of iridium (Ir), and has a thickness of 20 nm. The platinum layer 63 is made of platinum (Pt), and has a thickness of 60 nm. The second iridium layer 64 is made of iridium (Ir), and has a thickness of 20 nm. Subsequently, as shown in FIG. 4B, a titanium layer 65 is formed on the lower electrode film 60. The titanium layer 65 is made of titanium (Ti), and has a thickness of 1 nm to 20 nm. In the case of this embodiment, the thickness of the titanium layer 65 is 4.5 nm. The provision of the titanium layer 65 on the lower electrode film 60 in this manner makes it possible to control the priority orientation of the piezoelectric layer 70 in order that the priority orientation can be equal, for example, to the (100) orientation while, in a subsequent step, the piezoelectric layer 70 is being formed on the lower electrode film 60 with the titanium layer 65 in between. Accordingly, this makes it possible to obtain the piezoelectric layer 70 which is suitable as an electromechanical transducing element. Incidentally, the titanium layer 65 is made into an intermediate product, such as lead titanate, while the piezoelectric layer 70 is being formed by baking. Thus, the titanium layer 65 helps the piezoelectric layer 70 to become crystallized, and accordingly makes it possible to obtain desirable crystals. Depending on the thickness of the titanium layer 65, the titanium layer 65 may disappear after the baking, because the titanium in the layer is diffused into the piezoelectric layer 70 or the lower electrode film 60. Otherwise, the titanium layer 65 may remain between the lower electrode film 60 and the piezoelectric layer 70. In the case of this embodiment, it is supposed that, as shown in FIG.

2, the titanium layer 65 disappears because the titanium in the layer is diffused while the piezoelectric layer 65 is being formed.

Figure 4C:
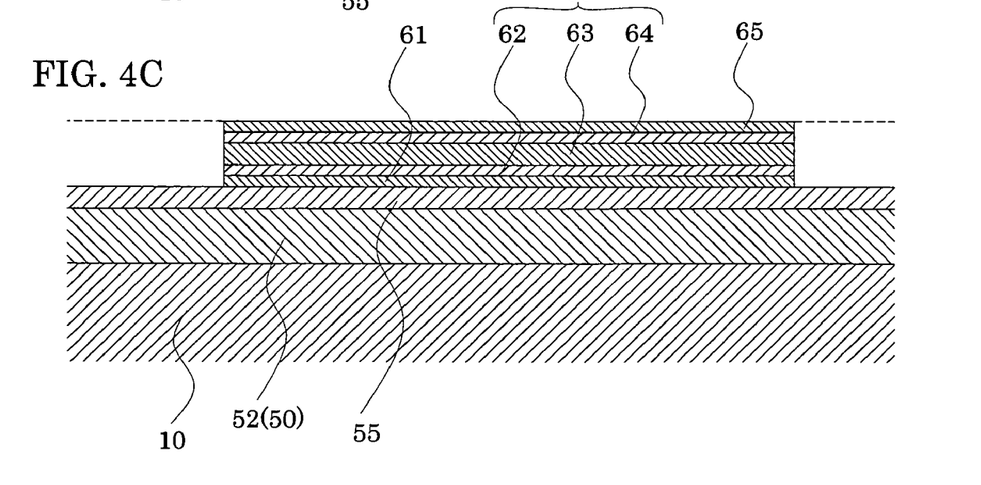

In addition, the adhesion layer 61, the three layers 62 to 64 constituting the lower electrode film 60, and the titanium layer 65 can be completed by forming these layers by means of the DC magnetron sputtering method and by subsequently processing these layers thermally. Furthermore, it is desirable that at least the three layers 62 to 64 constituting the lower electrode film 60 and the titanium layer 65 should be formed consecutively without releasing these layers from the vacuum state in the sputtering apparatus. Specifically, the three layers constituting the lower electrode film 60 are prone to delaminate. For this reason, the consecutive formation of the three layers constituting the lower electrode film 60 makes it possible to enhance adhesion among the three layers. After the adhesion layer 61, the layers 62 to 64 constituting the lower electrode film 60 and the titanium layer 65 are formed by the lamination, these layers are patterned, and thus the lower electrode film 60 is completed, as shown in FIG. 4C.

With regard to the titanium layer 65 formed on such a lower electrode film 60, it is desirable that the contact angle of water to the surface of the titanium layer 65 should be no less than 40°. It is more desirable that the contact angle should be no less than 60°. This is because, while the piezoelectric layer 70 is being formed on the titanium layer 65 by means of an MOD method, it is intended that an MOD solution will be prevented from being applied unevenly to the top of the titanium layer 65, and that the piezoelectric layer 70 exhibiting improved piezoelectric properties will be obtained.

Furthermore, for the purpose of causing the contact angle of water to the surface of the titanium layer 65 to be no less than 40°, it is desirable that the contact angle of water to the surface of the second iridium layer 64, which is the uppermost layer in the lower electrode film 60, should be no less than 60°. It is more desirable that the contact angle of water to the surface of the second iridium layer 64 should be no less than 70°.

It should be noted that the contact angle of water to the surface of the second iridium layer 64 and the contact angle of water of the surface of the titanium layer 65 can be adjusted by changing sputtering conditions, which are adopted while the second iridium layer 64 and the titanium layer 65 are being formed by means of the sputtering method, whenever deemed necessary.

Thereafter, the piezoelectric layer 70 made of lead-zirconate-titanate (PZT) is formed. In this regard, the piezoelectric layer 70 is formed by means of what is termed as the MOD (Metal Organic Deposition) method. In the case of this embodiment, an organometallic compound, such as metal alkoxide, is dissolved into alcohol, and a hydrolysis inhibitor is added to the resultant organometallic compound. Thus, the MOD solution in the form of a colloidal solution is obtained. Subsequently, the MOD solution is applied, followed by drying and baking. Thus, the piezoelectric layer 70 made of metal oxide is obtained. Incidentally, lead-zirconate-titanate is enumerated as a material for the piezoelectric layer 70. However, a material for the piezoelectric layer 70 is not limited to lead-zirconate-titanate. It does not matter that other piezoelectric materials are used as a material for the piezoelectric layer 70. Examples of the piezoelectric materials include relaxor ferroelectrics (for example, PMN-PT, PZN-PT and PNN-PT).

Figure 5A:
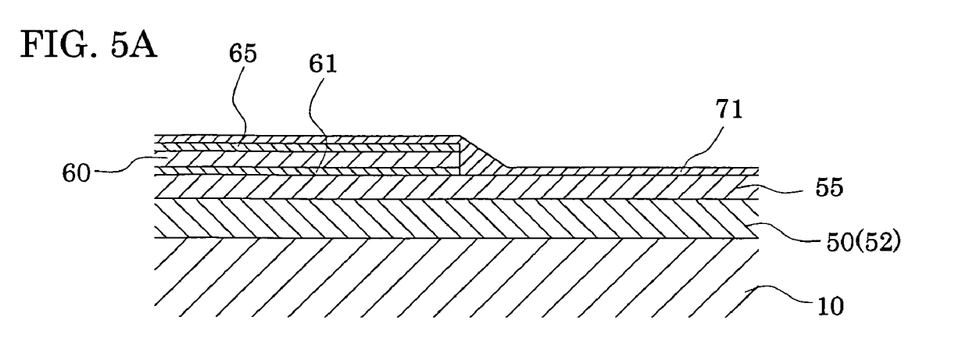
FIGS. 5A to 5C are cross-sectional views showing the method of manufacturing the recording head according to embodiment 1 of the invention.

A specific sequence of forming the piezoelectric layer 70 is as follows. First of all, as shown in FIG. 5A, a piezoelectric precursor film 71 which is a PZT precursor film is formed on the lower electrode film 60 (titanium layer 65). Specifically, the MOD solution containing the organometallic compound is applied above the passage-forming substrate 10 over which the lower electrode film 60 is formed (applying step). At this time, the contact angle of water to the surface of the titanium layer 65 which is formed on the lower electrode film 60 is caused to be no less than 40°. Accordingly, this makes it possible to evenly apply the MOD solution to the top of the titanium layer 65. Incidentally, if an MOD solution with a surface tension of 20 mN/m to 30 mN/m, and with a rate of polar components which is 25 to 35%, is used, this use makes it possible to evenly apply the MOD solution to the top of the titanium layer 65 with the contact angle of water to the surface thereof which is no less than 40°.

Subsequently, this piezoelectric precursor film 71 is heated to a predetermined temperature, and is dried for a certain length of time. In the case of this embodiment, the piezoelectric precursor film 71 can be dried up by keeping the piezoelectric precursor film 71 at a temperature of 170° C. to 180° C. for 8 minutes to 30 minutes. In addition, it is desirable that a rate of temperature rise in the drying step should be 0.5° C./sec to 1.5° C./sec. Incidentally, what has been referred to as the "rate of temperature rise" is defined as a rate of change from Temperature 1 through Temperature 2 with respect of time. Temperatures 1 and 2 are calculated in the following manner. To begin with, the difference between a temperature (room temperature), at which the heating is started, and a temperature which the piezoelectric precursor film 71 reaches by the heating is obtained. Thereafter, Temperature 1 is obtained by adding 20% of the difference to the temperature at which the heating is started. Temperature 2 is obtained by adding 80% of the difference to the temperature at which the heating is started. In a case where, for example, the temperature is raised from room temperature (25° C.) to 100° C. in 50 seconds, the rate of temperature rise is expressed with the following equation.

$$(100-25) \times (0.8-0.2)/50 = 0.9 [° C./sec]$$

Thereafter, the piezoelectric precursor film 71, which has been dried, is heated to a predetermined temperature, and is kept at that temperature for a certain length of time. Thereby, the piezoelectric precursor film 71 is dewaxed. In the case of this embodiment, for example, the piezoelectric precursor film 71 is heated to a temperature of approximately 300° C. to 400° C., and is kept at the temperature for approximately 10 minutes to 30 minutes. Thus, the piezoelectric precursor film 71 is dewaxed. Incidentally, what has been referred to as "dewaxing" means that organic components contained in the piezoelectric precursor film 71 are removed, for example, in the form of $NO_2$, $CO_2$, $H_2O$ and the like from the piezoelectric precursor film 71. Moreover, it is desirable that, in the dewaxing step, the rate of temperature rise should be 0.5° C./sec to 1.5° C./sec.

Figure 5B:
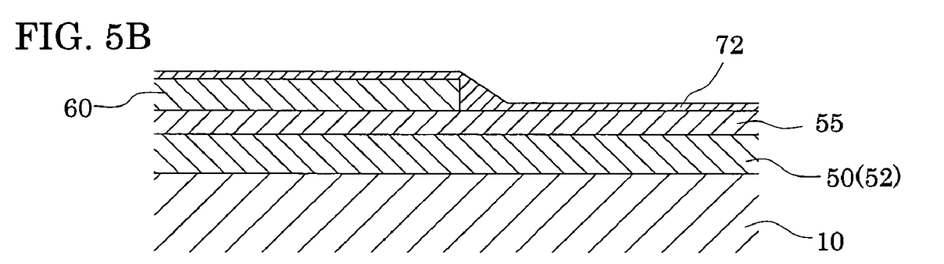

After that, the piezoelectric precursor film 71 is heated to a predetermined temperature, and is kept at that temperature for a certain length of time. Thus, the piezoelectric precursor film 71 is crystallized. Thereby, a piezoelectric film 72 is formed as shown in FIG. 5B (baking step) It is desirable that, in the baking step, the piezoelectric precursor film 71 should be heated to a temperature of 680° C. to 900° C. In the case of this embodiment, the piezoelectric precursor film 71 is baked by heating the piezoelectric precursor film 71 at 680° C. for 5 minutes to 30 minutes. Thus, the piezoelectric film 72 is formed. It is desirable that, in the baking step, the rate of temperature rise should not be more than 15° C./sec.

It should be noted that, for example, a hot plate, an RTP (Rapid Thermal Processing) system and the like can be used as a heating apparatus to be used in the drying, dewaxing and baking steps. The RTP system performs the thermal process by irradiation from an infrared lamp.

Figure 5C:
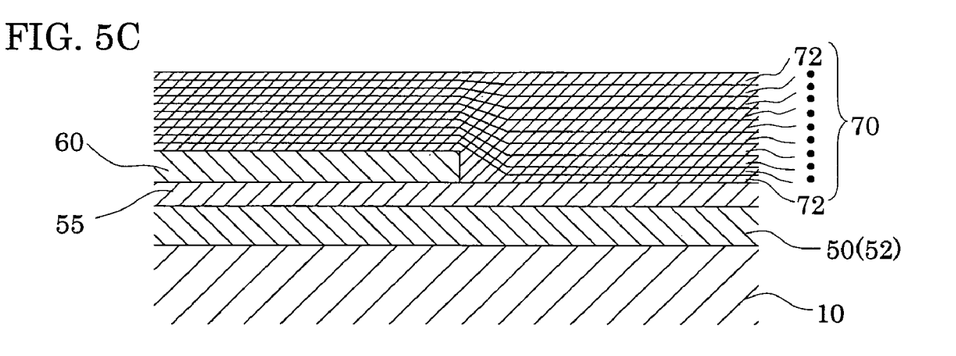

Thereafter, a piezoelectric-film forming step including the applying, drying, dewaxing and baking steps is repeated a plurality of times. In the case of this embodiment, the piezoelectric film forming step is repeated 10 times. Thereby, the piezoelectric layer 70 is formed as shown in FIG. 5C. The piezoelectric layer 70 is made up of 10 piezoelectric films 72, and has a predetermined thickness. In a case where, for example, the film thickness of the sol which is applied each time is approximately 0.1 μm, the total film thickness of the piezoelectric layer 70 is approximately 1.1 μm.

If the piezoelectric layer 70 is formed on the titanium layer 65 with the contact angle of water to the surface thereof which is no less than 40° by means of the MOD method in this manner, this makes it possible to evenly apply the MOD solution to the top of the titanium layer 65. Accordingly, this makes it possible to obtain the piezoelectric layer 70 exhibiting satisfactory piezoelectric properties.

In this respect, a lower electrode film 60 and a titanium layer 65 were formed on an insulation film 55 over a passage-forming substrate 10 by use of each of apparatuses A to C. Sputtering conditions were different among the apparatuses A to C. Thereafter, the lower electrode film 60 and the titanium layer 65, which have been formed by use of each of the apparatuses A to C, were thermally processed by an apparatus D. In addition, another lower electrode film 60 and another titanium layer 65, which have been formed by use of the apparatus C, were thermally processed by an apparatus E. Thermal processing conditions were different between the apparatuses D and E. Subsequently, the piezoelectric layer 70 was formed on each of the resultant titanium layers 65 by use of the MOD method. After that, the contact angle of water to the surface of each of the lower electrode films 60, which had been formed respectively by use of the apparatuses A to C, was measured. In addition, an orientation ratio for each of the piezoelectric layers 70, which had been formed by use of the apparatuses A to C, was measured. Table 1 shows results of these measurements.

The following facts as shown in Table 1 were found. With regard to the titanium layer 65 formed by use of the apparatus A, the contact angle of water to the surface was large. Even though the film thickness of the titanium layer 65 was increased, the contact angle of water to the surface was not decreased to a large extent. The contact angle of water to the surface was the smallest when the optimal film thickness of the titanium layer was approximately 4.5 nm. With regard to the titanium layer 65 formed by use of the apparatus B, the contact angle of water to the surface was smaller than the contact angle of water to the surface of the titanium layer 65 formed by use of the apparatus A. However, even though the film thickness of the titanium layer 65 formed by use of the apparatus B was increased, the contact angle of water to the surface was not decreased to a large extent. With regard to the titanium layer 65 formed by use of the apparatus C, the contact angle of water to the surface was smaller than the contact angle of water to the surface of the titanium layer 65 formed by use of the apparatus A. In addition, when the film thickness of the titanium layer 65 formed by use of the apparatus C was increased, the contact angle of water to the surface was decreased to a large extent. Moreover, when the other lower electrode film 60 and the other titanium layer 65, which had been formed by the apparatus C, were thermally processed by use of the apparatus E, the contact angle of water to the surface of the titanium layer 65 was further decreased.

With regard to the piezoelectric layer 70 on the lower electrode film 60 and the titanium layer 65 which had been formed by use of the apparatus A, the priority orientation was the (100) orientation, and the ratio of the (100) orientation was no less than 70%. With regard to the piezoelectric layer 70 on the lower electrode film 60 and the titanium layer 65 which had been formed by use of the apparatus B, the priority orientation was the (100) orientation, and the ratio of the (100) orientation was 50% to 70%. In the two cases, the piezoelectric layers 70 exhibiting satisfactory piezoelectric properties were able to be obtained. In contrast to these piezoelectric layers 70, with regard to the piezoelectric layer 70 on the lower electrode film 60 and the titanium layer 65 which had been formed by use of the apparatus C, the priority orientation was the (111) orientation, and the ratio of the (100) orientation was low, or not higher than 30%. As a result, the piezoelectric layer 70 exhibiting satisfactory piezoelectric

TABLE 1

| Formation of Lower Electrode Film | Film Thickness of Titanium Layer [nm] | Apparatus A | Apparatus B | Apparatus C |
|---|---|---|---|---|
| Optimal Film Thickness of Titanium Layer | | 4.5 nm | 1.5 nm | 1.5 nm |
| Thermal Process before Application | | | Apparatus D | Apparatus E |
| Unevenness of Application | | | OK | NG |
| Priority Orientation of Piezoelectric Layer | | (100) | (100) | (111) |
| Ratio of (100) Orientation of Piezoelectric Layer | | 70% and over | 50%-70% | Up to 30% |
| Contact Angle of Water to Surface of Titanium Layer Formed on lower electrode film [°] | 0 | | 73.6 | 54.9 |
| | 1 | | 69.5 | |
| | 1.5 | | 47.3 | 29.3 | 19.5 |
| | 3 | 64.9 | 46.1 | 32.7 |
| | 4.5 | | 44.3 | |
| | 5 | 66.9 | | |
| | 6 | | 45.6 | | properties was not able to be obtained. Incidentally, what has been referred to as the "orientation ratio" is calculated by use of the following expression:

XRD intensity in the (100) orientation/(XRD intensity in the (100) orientation+XRD intensity in the (110) orientation +XRD intensity in the (111) orientation)

In addition, the optimal film thickness of each of the titanium layers shown in Table 1 was that which maximized the ratio of the (100) orientation of the titanium layer.

As a result, the following facts have been found. The larger the contact angle of water to the surface of the titanium 65 was, the larger the ratio of the (100) orientation of the piezoelectric layer 70 was. When the contact angle of water to the surface of the titanium layer 65 was caused to be 40° or greater (preferably 60° or greater), this made it possible to prevent the MOD solution from being unevenly applied to the top of the titanium layer 65. Accordingly, this made it possible to obtain the piezoelectric layer 70 exhibiting satisfactory piezoelectric properties.

It should be noted that, with properties of the MOD solution used for forming the piezoelectric layers 70, the surface tension was 26 mN/m, and the ratio of the polar component was 31.1%. The surface tension of the MOD solution was found by measuring the surface tension of the MOD solution in the air and perfluoro-hexane by use of the pendant-drop method. In addition, what has been referred to as the "ratio of polar component" is calculated by use of the following expression:

$\gamma^p$(polar component)/($\gamma^p$(polar component)+$\gamma^d$(dispersive component))

Figure 6A:
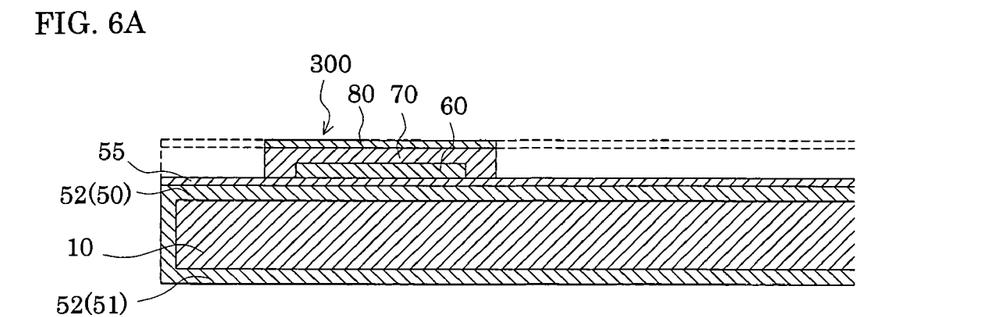
FIGS. 6A to 6D are cross-sectional views showing the method of manufacturing the recording head according to embodiment 1 of the invention.
Figure 6B:
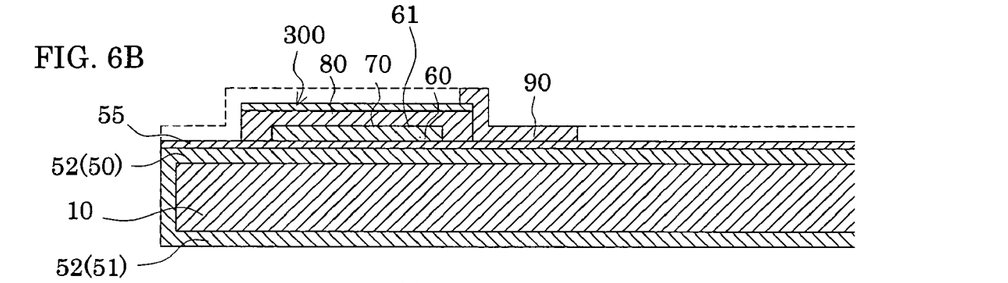

As shown in FIGS. 5A to 5C, the piezoelectric layer 70 is formed through the steps as described above. Thereafter, the upper electrode film 80 made, for example, of iridium is formed on the entire surface of the passage-forming substrate 10 as shown in FIG. 6A. Subsequently, the piezoelectric layer 70 and the upper electrode film 80 are patterned in areas respectively facing the pressure generating chambers 12. Thus, the piezoelectric elements 300 are formed. After that, the lead electrodes 90 are formed. Specifically, as shown in FIG. 6B, the lead electrodes 90 are formed on the entire surface of the passage-forming substrate 10. The lead electrode 90 is made, for example, of gold (Au) or the like. Thereafter, the lead electrode 90 is patterned for each of the piezoelectric elements 300 by use of a mask pattern (not illustrated) made, for example, of a resist or the like.

Figure 6C:
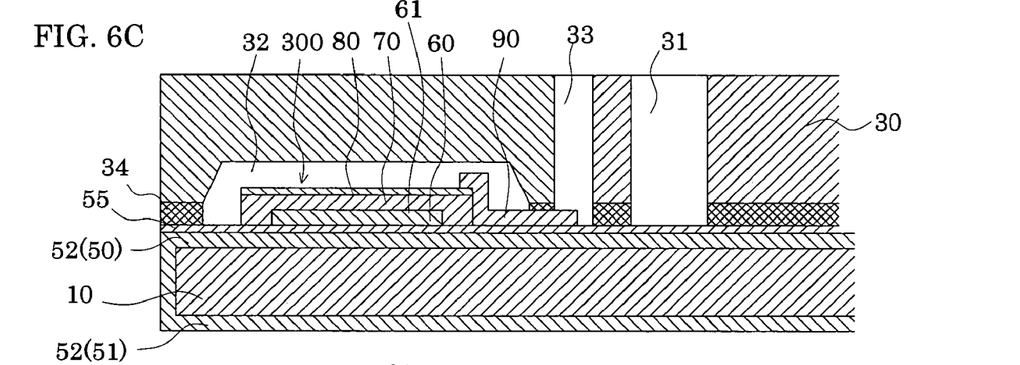

Subsequently, as shown in FIG. 6C, the protective plate 30 in which to hold the plurality of patterned piezoelectric elements 300 is joined to the top of the passage-forming substrate 10, for example, by use of the adhesive agent 34. Incidentally, the reservoir portion 31, the piezoelectric element holding portion 32 and the like have been formed beforehand in the protective plate 30. In addition, the protective plate 30 is made, for example, of the single crystal silicon substrate with a thickness of approximately 400 μm. Rigidity of the passage-forming substrate 10 is remarkably enhanced by joining the protective plate 30 to the passage-forming substrate 10.

Figure 6D:
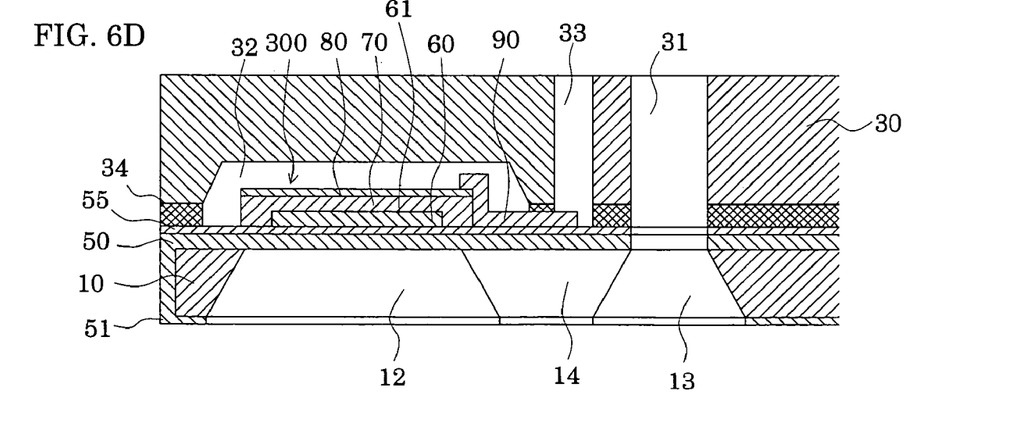

Thereafter, as shown in FIG. 6D, the silicon dioxide film 52 is patterned into a predetermined shape, and thus the protective film 51 is formed. The silicon dioxide film 52 is situated on a surface of the passage-forming substrate 10, the surface being opposite to the surface on which the piezoelectric elements 300 are formed. Subsequently, by using the protective film 51 as a mask, the passage-forming substrate 10 is anisotropically etched (wet-etched) by use of an alkaline solution, such as KOH. Thereby, the pressure generating chambers 12, the communicating portion 13, the ink supply paths 14 and the like are formed in the passage-forming substrate 10.

Subsequently, the nozzle plate 20 is joined to a surface of the passage-forming substrate 10, the surface being opposite to the surface to which the protective plate 30 is joined. In the nozzle plate 20, the nozzle orifices 21 are pierced. Concurrently, the compliance plate 40 is joined to the protective plate 30. Thereby, the ink-jet recording head as shown in FIG. 1 is constructed.

It should be noted that, in actual practice, a number of chips are constructed on a single wafer at a time by means of the series of film forming processes and anisotropic etching processes. After the series of film forming processes and anisotropic etching processes are completed, the resultant wafer is diced into the passage-forming substrates 10 each in a single-chip size. Thereby, the ink-jet recording heads are constructed.

Other Embodiment

The invention has been described above on the basis of embodiment 1. However, the basic configuration according to the invention is not limited to the foregoing example. For example, in the case of embodiment 1, the piezoelectric precursor film 71 is applied, dried, and dewaxed, followed by baking. Thereby, the piezoelectric film 72 is formed. However, the process of forming the piezoelectric film 72 is not particularly limited to this example. It does not matter whether the following process is performed. For example, the steps of applying, drying, and dewaxing the piezoelectric precursor film 71 are repeated a plurality of times, for example, twice. Thereafter, the resultant piezoelectric precursor films 71 are baked. Thereby, the piezoelectric film 72 is formed.

Moreover, in the case of embodiment 1, the lower electrode film 60 is formed by patterning. Thereafter, the piezoelectric layer 70 is formed. However, it does not matter whether the following process is performed for the conveniences of arrangement of the devices. The lower electrode film is formed on the entire surface for the passage-forming substrate 10 without patterning the lower electrode film. Thereafter, a first piezoelectric film 72 is formed. Subsequently, the lower electrode film is patterned.

What is claimed is:

1. A method of manufacturing a piezoelectric element, the method comprising:
   forming a lower electrode whose uppermost layer is made of iridium on a substrate;
   forming a titanium layer, whose water contact angle to the surface thereof is no less than 40°, on the lower electrode;
   forming a piezoelectric layer on the titanium layer by a metal organic deposition (MOD) method by use of an MOD solution with a surface tension of 20 mN/m to 30 mN/m and with a ratio of polar component which is 25% to 35%; and
   forming an upper electrode on the piezoelectric layer.

2. The method of manufacturing a piezoelectric element according to claim 1, forming the titanium layer whose water contact angle to the surface thereof is no less than 60° on the lower electrode.

3. The method of manufacturing a piezoelectric element according to claim 2, wherein the forming the lower electrode comprises:
   forming a first iridium layer made of iridium;

forming a platinum layer made of platinum on the first iridium layer; and forming a second iridium layer made of iridium on the platinum layer.

4. The method of manufacturing a piezoelectric element according to claim 1, wherein the forming the lower electrode comprises:

forming a first iridium layer made of iridium;

forming a platinum layer made of platinum on the first iridium layer; and forming a second iridium layer made of iridium on the platinum layer.

* * * * *